United States Patent
Alsasua et al.

(10) Patent No.: US 11,887,651 B2
(45) Date of Patent: *Jan. 30, 2024

(54) TEMPERATURE INFORMED MEMORY REFRESH

(71) Applicant: Micron Technology, Inc., Boise, ID (US)

(72) Inventors: Gianni Stephen Alsasua, Rancho Cordova, CA (US); Harish Reddy Singidi, Fremont, CA (US); Kishore Kumar Muchherla, Fremont, CA (US); Sampath Ratnam, San Jose, CA (US); Ashutosh Malshe, Fremont, CA (US); Vamsi Pavan Rayaprolu, San Jose, CA (US); Renato Padilla, Jr., Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/745,262

(22) Filed: May 16, 2022

(65) Prior Publication Data

US 2022/0277787 A1    Sep. 1, 2022

Related U.S. Application Data

(63) Continuation of application No. 17/238,846, filed on Apr. 23, 2021, now Pat. No. 11,335,394, which is a
(Continued)

(51) Int. Cl.
*G11C 11/406*  (2006.01)
*G06F 13/16*   (2006.01)
*G11C 7/04*    (2006.01)

(52) U.S. Cl.
CPC .... *G11C 11/40626* (2013.01); *G06F 13/1636* (2013.01); *G11C 7/04* (2013.01);
(Continued)

(58) Field of Classification Search
CPC ............... G11C 11/40626; G11C 7/04; G11C 2211/4061; G11C 11/40615; G11C 16/3418; G11C 11/40622; G06F 13/1636
See application file for complete search history.

(56) References Cited

U.S. PATENT DOCUMENTS 6,405,277 B1  6/2002  Jen et al.
8,174,780 B1  5/2012  Tsai et al.
(Continued)

FOREIGN PATENT DOCUMENTS

CN   101061548 A   10/2007
CN   101159164 A   4/2008
(Continued)

OTHER PUBLICATIONS

"Chinese Application Serial No. 201980071437.5, Office Action dated Nov. 2, 2021", w/o English translation, 6 pgs.
(Continued)

*Primary Examiner* — Uyen Smet
(74) *Attorney, Agent, or Firm* — Schwegman Lundberg & Woessner, P.A.

(57) ABSTRACT

Devices and techniques for temperature informed memory refresh are described herein. A temperature counter can be updated in response to a memory device write performed under an extreme temperature. Here, the write is performed on a memory device element in the memory device. The memory device element can be sorted above other memory device elements in the memory device based on the tem-
(Continued)

perature counter. Once sorted to the top of these memory device elements, a refresh can be performed the memory device element.

20 Claims, 6 Drawing Sheets

Related U.S. Application Data continuation of application No. 17/017,201, filed on Sep. 10, 2020, now Pat. No. 10,998,034, which is a continuation of application No. 16/855,579, filed on Apr. 22, 2020, now Pat. No. 10,796,745, which is a continuation of application No. 16/138,115, filed on Sep. 21, 2018, now Pat. No. 10,672,452.

(52) U.S. Cl.
CPC .............. *G11C 11/40615* (2013.01); *G11C 2211/4061* (2013.01)

(56) References Cited

U.S. PATENT DOCUMENTS

| | | | |
|---|---|---|---|
| 9,099,155 | B1 | 8/2015 | Kataria et al. |
| 10,303,382 | B1 | 5/2019 | Chu et al. |
| 10,672,452 | B2 | 6/2020 | Alsasua et al. |
| 10,796,745 | B2 | 10/2020 | Alsasua et al. |
| 10,998,034 | B2 | 5/2021 | Alsasua et al. |
| 11,335,394 | B2 | 5/2022 | Alsasua et al. |
| 2008/0030893 | A1 | 2/2008 | Yamagata |
| 2008/0084738 | A1 | 4/2008 | Philipp et al. |
| 2009/0154279 | A1* | 6/2009 | Hong ..................... G01K 7/00 374/170 |
| 2011/0145521 | A1 | 6/2011 | Aoki et al. |
| 2011/0235434 | A1 | 9/2011 | Byom et al. |
| 2012/0033519 | A1 | 2/2012 | Confalonieri et al. |
| 2012/0134213 | A1 | 5/2012 | Choi et al. |
| 2014/0101371 | A1 | 4/2014 | Nguyen et al. |
| 2015/0036445 | A1* | 2/2015 | Yoshida ............ G11C 11/40611 365/222 |
| 2016/0196062 | A1 | 7/2016 | Nakata et al. |
| 2017/0255403 | A1 | 9/2017 | Sharon et al. |
| 2018/0293029 | A1 | 10/2018 | Achtenberg et al. |
| 2019/0096473 | A1* | 3/2019 | Park ......................... G11C 7/04 |
| 2020/0098421 | A1 | 3/2020 | Alsasua et al. |
| 2020/0251162 | A1 | 8/2020 | Alsasua et al. |
| 2020/0411083 | A1 | 12/2020 | Alsasua et al. |
| 2021/0241823 | A1 | 8/2021 | Alsasua et al. |

FOREIGN PATENT DOCUMENTS

| | | |
|---|---|---|
| CN | 101188141 A | 5/2008 |
| CN | 101896801 A | 11/2010 |
| CN | 103426467 A | 12/2013 |
| CN | 104766633 A | 7/2015 |
| CN | 107578792 A | 1/2018 |
| CN | 112930567 A | 6/2021 |
| CN | 112930567 | 6/2022 |
| CN | 114913893 | 8/2022 |
| KR | 20110111551 A | 10/2011 |
| WO | WO-2020061335 A1 | 3/2020 |

OTHER PUBLICATIONS

"Chinese Application Serial No. 201980071437.5, Voluntary Amendment Filed Sep. 30, 2021", w/ English Claims, 22 pgs.
"International Application Serial No. PCT/US2019/051965, International Preliminary Report on Patentability dated Apr. 1, 2021", 7 pgs.
"International Application Serial No. PCT/US2019/051965, International Search Report dated Jan. 7, 2020", 3 pgs.
"International Application Serial No. PCT/US2019/051965, Written Opinion dated Jan. 7, 2020", 5 pgs.
"Korean Application Serial No. 10-2021-7011366, Notice of Preliminary Rejection dated Dec. 20, 2022", with English translation, 13 pages.
"European Application Serial No. 19862084.1, Extended European Search Report dated May 11, 2022", 7 pgs.

* cited by examiner

FIG. 6 though related in memory or processing to what is shown on the page.

TEMPERATURE INFORMED MEMORY REFRESH

PRIORITY APPLICATION

This application is a U.S. application Ser. No. 17/238,846, filed Apr. 23, 2021, which is a continuation U.S. application Ser. No. 17/017,201, filed Sep. 10, 2020, now issued as U.S. Pat. No. 10,998,034, which is a continuation of U.S. application Ser. No. 16/855,579, filed Apr. 22, 2020, now issued as U.S. Pat. No. 10,796,745, which is a continuation of U.S. application Ser. No. 16/138,115, filed Sep. 21, 2018, now issued as U.S. Pat. No. 10,672,452, all of which are incorporated herein by reference in their entirety.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or storage class memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

Flash devices work by trapping a charge in a cell (e.g., in a charge trap or floating gate) that then interferes with opening a channel by a control gate. The control gate read voltage is calibrated to be between two trapped charge states. Accordingly, if the channel opens (e.g., the control gate voltage can override the trapped charge) the cell has one value (e.g., a '1' in a single level cell (SLC)) and a different value if the channel does not open (e.g., a '0' in an SLC). Thus, it is important that the trapped charge is calibrated with the read voltage.

The calibration of the trapped charge and read voltage can be affected by several circumstances. For example, the calibration of the trapped charge and the read voltage is affected by temperature. Generally, the threshold voltage of a flash transistor changes with temperatures. A memory controller can adjust the read voltage based on ambient temperature. The threshold voltage and the read voltage adjustment cannot go hand in hand because there are several million transistors in a NAND package and there can be transistor-to-transistor differences with respect to the threshold voltage movement for temperature. Thus, programming at one temperature and reading at a different temperature tends to exacerbate margins. A typical result of writing at temperatures that are hot or cold is increased read errors. These read errors tend to diminish perceived performance of the device because error correction is performed during the read, resulting in greater latencies in the read-request and data delivery cycle.

To put it another way, memory (e.g., NAND Flash) devices experience higher raw bit error rates (RBERs) when there is a large difference between the temperature at which data is written—the write temperature—and the temperature at which data is read—the read temperature. Read performance can be impacted due to these RBERs because the device compensates for the difference in write and read temperatures through error-handling. Traditionally, the error-handling addresses higher numbers of RBER events by calibrating the read voltage levels to correctly read or recover the data at the cost of increased latency in servicing a request. While all NAND devices can be affected by the error-handling events, QLC and TLC devices with performance trims can be affected to a greater degree because these devices tend to have smaller margins to tolerate temperature effects, and thus, error-handling is triggered more often. Cross-temperature—when the write and read temperatures differ—problems, when coupled with other intrinsic NAND failure mechanisms—such as data retention, read disturb, wear, or any other intrinsic failure mechanisms—can further reduce the margins and increased error-handling processing.

The cross-temperature issues described above—e g, minimizing the error handling trigger rates and unrecoverable errors—can be addressed by detecting high cross-temperature events and refreshing blocks appropriately without impacting request performance. Maintaining a look-up table of write temperature data for blocks is a way to minimize the cross-temperature related performance impact or reliability issues. Here, knowledge of the written temperature can be used to apply read voltage adjustments pre-emptively for host reads. The need to maintain a look-up table, which can be expensive in terms of on-device memory (e.g., RAM), is a drawback of this approach. What is needed is an effective correction of extreme—either too hot or too cold—write temperatures that has minimal impact on processing or record keeping for the device.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments discussed in the present document.

DETAILED DESCRIPTION

To avoid cross-temperature events with minimal device (e.g., firmware, processing etc.) overhead for the device, extreme write temperature counters can be maintained at a superblock level to identify refresh candidates. Refreshing—re-writing to a new cell—when write temperatures are acceptable (e.g., will likely correlate to read temperatures) preserves data integrity and reduces RBERs at the cost of wear on the cells themselves (e.g., via write amplification). Thus, too much refresh activity results in waste of both cell program and erase cycles and processing (e.g., leads to a performance impact for the flash device as resources are used to perform the refresh). The extreme write temperature counters provide an efficient way to order elements to get the greatest reduction in error-handling events due to cross-temperature problems while minimizing the number of refreshes used.

Although tracking could be performed at a block, page, die, or other level, superblocks provide an attractive aggregation of memory device elements upon which to attach a write temperature counter. Although NAND devices permit write and read addressing at a page level and erasure addressing at a block level, there are some practical difficulties in such fine grained resolution. These difficulties can include addressing overhead for a variety of tasks and operations, including maintenance of flash translation layer (FTL) tables. To address these issues, blocks are generally aggregated into a single logical entity (e.g., a superblock) to which data is written. Traditionally, the aggregated blocks included blocks from every plane in every die of a NAND array in a flash memory system. This arrangement provides some performance benefits, such as parallel execution of a write command across die.

The aggregated block concept permits tracking fewer storage units, relieving pressure on temperature counter and FTL tables and management. This can be important in resource limited devices, such as managed NAND, where available working memory (e.g., random access memory (RAM) holding system state) is limited. Using superblocks as a basic operational unit in the NAND device provides the efficient resource management discussed above with respect to aggregated block units while permitting more efficient maintenance operations (e.g., reduced latency and time to perform the operations) and effective device OP.

In an example, the technique described herein includes a metric that tracks data written at extreme temperatures with the least memory size penalty. Typically, a managed NAND controller writes data to open superblocks. There are generally a limited amount of open superblocks available at any given time. Ambient temperature is measured by the NAND device during a write and, at a superblock level, the NAND controller maintains one or both of a High Write Temperature Counter (HWTC) and Low Write Temperature Counter (LWTC). In an example, for each code word—is the data word after error correction codes are applied—written at a high temperature, the HWTC is incremented. Similarly, for each code word written at a low temperature, the LWTC is incremented. In an example, after a superblock is closed, the HWTC and the LWTC are stored in the memory device (e.g., in a NAND array as opposed to on-device RAM). In an example, a single counter (e.g., an extreme write temperature counter (EXWTC)) can be incremented when either a high temperature or a low temperature write occurs, and stored in the memory device.

In an example, when a superblock is erased or newly opened, the counters can be reset (e.g., initialized to zero). During low activity of the NAND device, such as when there are no pending read or write requests, the NAND device can efficiently perform maintenance operations such as a refresh of a superblock. Because this time can be limited, a better return on the refresh activity can be achieved by ordering the superblocks such that those with a higher concentration of extreme temperature writes (e.g., with higher HWTC, LWTC, or EXWTC values) are refreshed first. Thus, when the NAND device temperature is acceptable, superblocks with higher concentrations of data written at either high temperature or low temperature are refreshed. In an example, the sorting can include adding HWTC and LWTC to achieve a single value upon which to order the superblocks, sorting on HWTC and then using LWTC to sort among superblocks with the same HWTC value, the reverse (e.g., sorting on LWTC first), or on EXWTC. In an example, to reduce refreshes with minimal impact, the superblocks are not refreshed if the resulting sort value does not exceed a threshold. In an example, write temperature can be maintained in memory device meta-data, enabling code words marked with an extreme temperature (e.g., wither high or low) to be selectively garbage collected, avoiding a complete refresh of the superblock or other memory device element.

Figure 1:
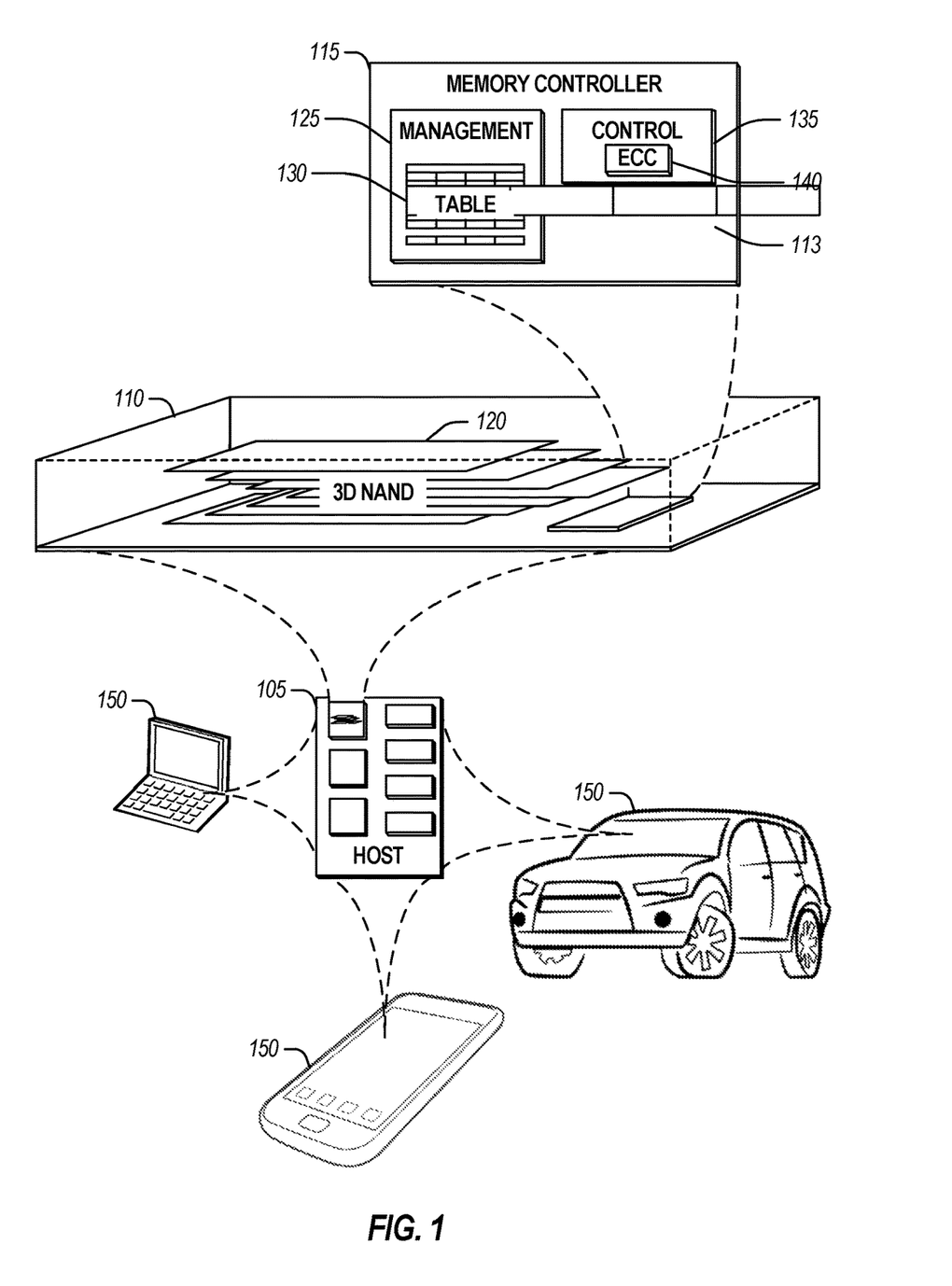
FIG. 1 illustrates an example of an environment including a memory device, according to an embodiment.

FIG. 1 illustrates an example of an environment 100 including memory system 110, according to an embodiment. The environment 100 is also illustrated as including a host device 105 configured to communicate with the memory system 110 over a communication interface. The host device 105 or the memory system 110 can be included in a variety of products 150, such as Internet of Things (IoT) devices (e.g., a refrigerator or other appliance, sensor, motor or actuator, mobile communication device, automobile, drone, etc.) to support processing, communications, or control of the product 150.

The memory system 110 includes a memory system controller 115 and a memory device 120 including, for example, a number of individual die (e.g., a stack of three-dimensional (3D) NAND die) or other media (e.g., organized as an array). In 3D architecture semiconductor memory technology, vertical structures are stacked, increasing the number of tiers, physical pages, and accordingly, the density of a memory device (e.g., a storage device). In an example, the memory system 110 can be a discrete memory or storage device component of the host device 105. In other examples, the memory system 110 can be a portion of an integrated circuit (e.g., system on a chip (SOC), etc.), stacked or otherwise included with one or more other components of the host device 105.

One or more communication interfaces can be used to transfer data between the memory system 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system, an electronic device, a processor, a memory card reader, or one or more other electronic devices external to the memory system 110. In some examples, the host 105 can be a machine having some portion, or all, of the components discussed in reference to the machine 600 of FIG. 6.

The memory system controller 115 can receive instructions from the host 105, and can communicate with the memory device 120, such as to transfer data to (e.g., write or erase) or from (e.g., read) one or more of the memory cells, planes, sub-blocks, blocks, or pages of the memory device 120. The memory system controller 115 can include, among other things, circuitry or firmware, including one or more components or integrated circuits. For example, the memory system controller 115 can include one or more memory control units, circuits, or components configured to control access across the memory device 120 and to provide a translation layer between the host 105 and the memory system 110.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of nonvolatile memory can have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory device, etc.), or generate device commands (e.g., to accomplish various memory management functions) for the memory controller 135 or one or more other components of the memory system 110.

Refreshing memory device elements is a management function that the memory manager 125 can perform. As noted above, refreshing carries a cost in terms of memory device element wear and processing time—which can increase power consumption as well as impact user perceived performance by delaying host request fulfillment while the processing completes. However, also as noted above, a refresh during a period of acceptable ambient temperature can provide an efficient correction to cross-temperature problems by re-writing data at an acceptable temperature when that data was originally written at an extreme temperature. Again, an extreme temperature is one that is beyond a pre-set temperature range for the device 110, while the acceptable temperature is within the range. Thus, an extreme temperature can be too hot or too cold as defined by the preset range. The preset range can be adjusted for different use-cases. For example, if the average temperature of a working environment is high, such as in an injection molding factory, the preset range can be set higher than in other use cases. In an example, the preset range is defined by a range of read temperatures as measured at the device 110 and can be adjusted over time.

To implement temperature informed refresh, the memory manager 125 is arranged to update a temperature counter in response to a write to the memory device 120 performed under an extreme temperature. Here, the write is performed on a memory device element in the memory device 120. In an example, the memory device write is a code word write. A code word is the result of encoding a piece of data with, for example, an error correction code. In general, the code word is the smallest unit that is written to the memory device, although several code words can be aggregated to write a page, block, superblock, etc. In an example, the memory device element is a superblock. Thus, every time a code word is written to the memory device element, the memory manager 125 compares an ambient temperature of the device 110 to the preset range to determine whether the write was under an extreme temperature. If the write is under an extreme temperature, a counter for the memory device element is updated (e.g., incremented by one) to track these writes.

In an example, the temperature counter is twenty bits. In an example, the temperature counter is reset to zero in response to erasure of the memory device element. Thus, as the memory device element no longer has valid data, the counter is reset to prepare for tracking new extreme temperature writes, and also to avoid having the invalid data refreshed unnecessarily. In an example, an extreme temperature is below a low write temperature threshold for the NAND device 110. In an example, the temperature counter includes a Low Temperature Write Counter (LWTC). In an example, an extreme temperature is above a high write temperature threshold for the NAND device 110. In an example, the temperature counter includes a High Temperature Write Counter (HWTC). In an example, an extreme temperature is either above a high write temperature threshold or below a low write temperature threshold for the NAND device 110. In an example, the temperature counter includes an Extreme Temperature Write Counter (EXWTC). Generally, the EXWTC is a combination of the LWTC and HWTC when knowing whether a write was during an extreme high temperature or extreme low temperature does not matter.

In an example, the temperature counter is stored separately from the memory device element. This example differs from storing the temperature counter, or counters, in metadata of the NAND element itself, such as is done with some superblock data, which can also be done. In an example, the temperature counter is stored in a volatile memory portion of the NAND device 110 in response to the memory device element being open. The volatile portion enables fast updates of the counter without undue wear on a NAND cell while it is likely that the counter is changing. In an example, the temperature counter is stored in the memory device 120 in response to the memory device element being closed. Here, once the memory device element is no longer being written to, the counter will no longer change, permitting the counter to be saved to a memory device cell without significant side effects. The counter or counters can be stored in the management tables 130 described below and treated similarly to other counters—such as a bad block count, write count, etc.—kept for a superblock or other memory device element, for example.

The memory manager 125 is arranged to sort the memory device element sorted above other memory device elements in the memory device 120 based on the temperature counter. Here, the memory device elements that have temperature counters are organized in order based on the temperature counter. In an example, the sorting includes combining a LWTC and a HWTC to create a sort-value that is compared against sort-values calculated for the other memory device elements. The combined LWTC and HWTC has a value that is equal to the EXWTC in cases where the EXWTC is used in lieu of, or in addition to, the LWTC and HWTC.

In an example, the memory manager 125 is arranged to exclude, from the sort, memory device elements with a corresponding temperature counter that is not beyond a minimum temperature-based refresh threshold. Thus, for a memory device element to be sorted by the memory manager 125, it has a sort-value that is beyond a minimum temperature-based refresh threshold. The minimum temperature-based refresh threshold operates to reduce refreshes with little to no benefit on device 110 performance. Thus, the minimum temperature-based refresh threshold establishes a baseline under which the extreme temperature counter or counters will not trigger a refresh. In an example, the minimum temperature-based refresh threshold is based on a raw bit error rate (RBER) of the NAND device. For example, if an average RBER of superblocks exceeds a threshold when the sum of the HWTC and LWTC counters are greater than X, then the minimum temperature-based refresh threshold is set to X. In an example, the minimum temperature-based refresh threshold is a percentage of bytes in the memory device element written at an extreme temperature. For example, if more than 30% of the bytes written are at an extreme temperature, then the minimum temperature-based refresh threshold is met.

The memory manager 125 is arranged to perform a refresh is performed on the memory device element in response to the sorting. In an example, the sorting is performed is in response to closure of the memory device element. In an example, the sorting is performed in response to an acceptable ambient temperature measurement on the device 110. In an example, the sorting is performed in response to a storage metric, such as less than a minimum number of free memory device elements being available, or other management functions such as a garbage collection being performed or triggered. The refresh is performed first on the memory device elements with the highest counter values and proceeds until the refresh is interrupted (e.g., by a request from the host 105), or an allocation of power or time is exceeded. Thus, in an example, to perform the refresh, the memory manager 125 is arranged to copy contents of the memory device element to a new memory device element. In an example, the copying of the contents is performed in response to a non-extreme temperature (e.g., acceptable) of the new memory device element. In an example, the copying of the contents is performed in response to a low-utilization period of the NAND device.

The memory manager 125 can include a set of management tables 130 configured to maintain various information associated with one or more component of the memory system 110 (e.g., various information associated with a memory array or one or more memory cells coupled to the memory system controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory system controller 115. In certain examples, if the number of detected errors for one or more of the error counts is above a threshold, the bit error can be referred to as an uncorrectable bit error. The management tables 130 can maintain a count of correctable or uncorrectable bit errors, among other things. In an example, the management tables 103 can include translation tables or a L2P mapping.

The memory controller 135 can include, among other things, circuitry or components configured to control memory operations associated with writing data to, reading data from, or erasing one or more memory cells of the memory system 110 coupled to the memory system controller 115. The memory operations can be based on, for example, host commands received from the host 105, or internally generated by the memory manager 125 (e.g., in association with wear leveling, error detection or correction, etc.).

The memory controller 135 can include an error correction code (ECC) component 140, which can include, among other things, an ECC engine or other circuitry configured to detect or correct errors associated with writing data to or reading data from one or more memory cells of the memory system 110 coupled to the memory system controller 115. The memory system controller 115 can be configured to actively detect and recover from error occurrences (e.g., bit errors, operation errors, etc.) associated with various operations or storage of data, while maintaining integrity of the data transferred between the host 105 and the memory system 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory device 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, can be selectively operated in SLC mode, or in a desired MLC mode (such as TLC, QLC, etc.).

In operation, data is typically written to or read from the NAND memory system 110 in pages, and erased in blocks. However, one or more memory operations (e.g., read, write, erase, etc.) can be performed on larger or smaller groups of memory cells, as desired. The data transfer size of a NAND memory system 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example, a page of data having a page size of 4 KB can include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or can require different amounts of metadata associated therewith. For example, different memory device types can have different bit error rates, which can lead to different amounts of metadata necessary to ensure integrity of the page of data (e.g., a memory device with a higher bit error rate can require more bytes of error correction code data than a memory device with a lower bit error rate). As an example, a multi-level cell (MLC) NAND flash device can have a higher bit error rate than a corresponding single-level cell (SLC) NAND flash device. As such, the MLC device can require more metadata bytes for error data than the corresponding SLC device.

The technique described herein uses very little system memory, and very little space in the memory device 120 (e.g., NAND array) to track extreme temperature writes. Because the refreshes (or selective garbage collection) occurs in the background, user perceived performance of the memory system 110 is not impacted by this technique, as is the case with many error-handling procedures. Moreover, because memory systems 110 already have access to ambient temperature information, memory device 120 element refreshes, and track superblock data, such as erase counts, read counts, etc., the technique can be integrated in the memory system controller 115 without introducing costly changes to the memory system controller 115 designs.

The efficiency of a code-word and superblock counter is great. For example, assuming a twenty-byte allocation for the HWTC and the LWTC respectively, sixteen million code words can be tracked for each superblock with five-byte allocations per superblock. Given twenty superblocks opened at any given time, the number of bytes used by the memory system's constrained memory to track the temperature counters is twenty times five bytes, or 100 bytes. If the memory device 120 has 1,000 superblocks, then the total RAM usage by the memory system 110 is roughly requires five kilobytes.

Figure 2:
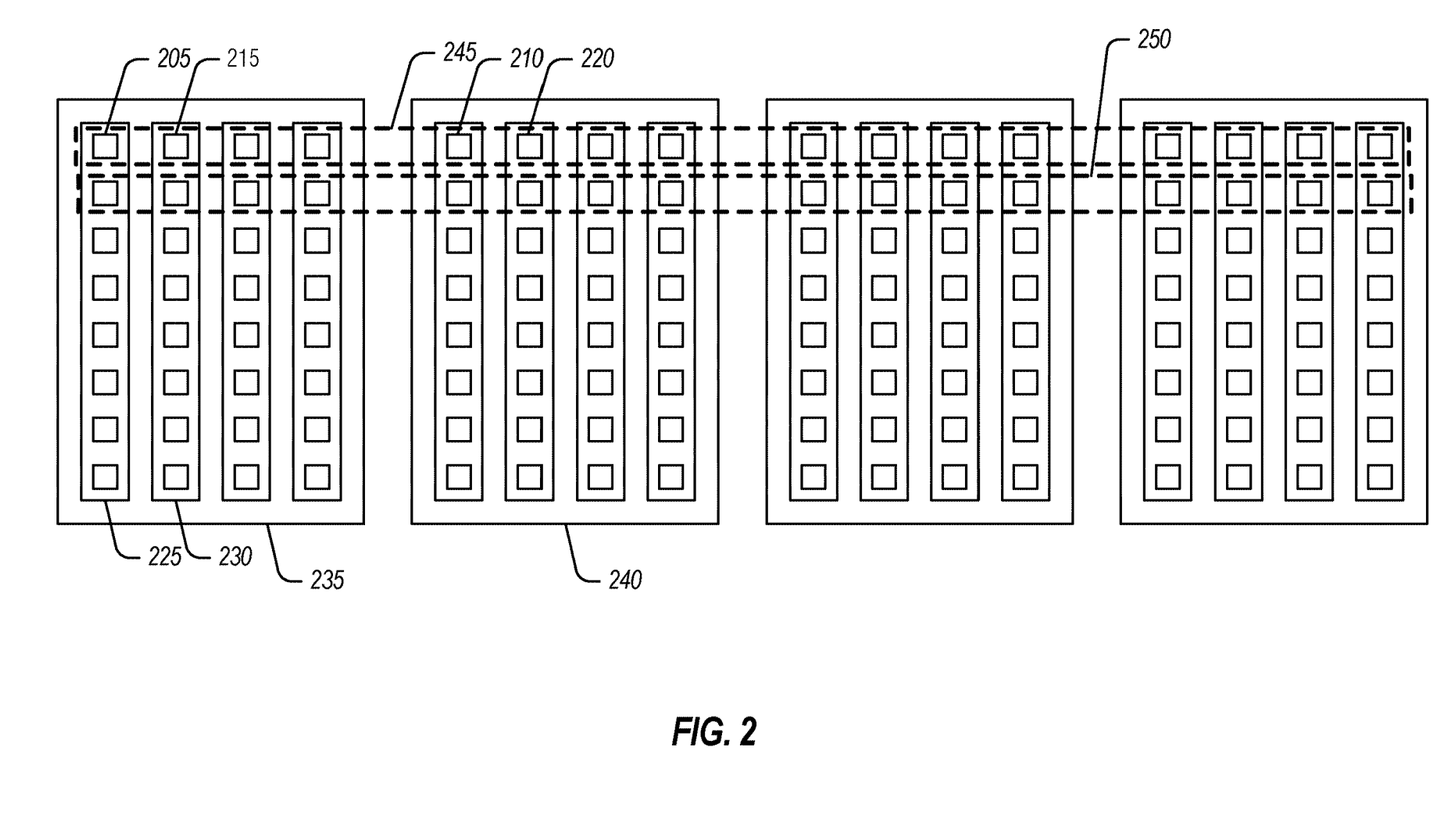
FIG. 2 illustrates an example of superblocks, according to an embodiment.

FIG. 2 illustrates an example of superblocks. Superblock 245 and superblock 250 are both complete, or full width, superblocks that span all four planes of all four die. To illustrate the block index relationship between planes and die, some blocks in each superblock are noted in FIG. 2. For example, superblock 245 includes blocks 205 and 215 of planes 225 and 230 respectively. In an example, block indexes cannot start over between planes. Thus, the block indexes for 205 and 215 are different even if they are both the first blocks in their respective planes. However, blocks 205 and 215 have the same indexes in die 235 as do blocks 210 and 220 in die 240. Thus, the set of blocks need only specify the indexes within a single die, and these indexes are applied across all die to create the superblock. In examples where block indexing restarts within a plane, then the superblock can be specified by a single index and a set of planes. Also, as illustrated, each superblock 245 and 250 has at most one block for a unique combination of die and plane, although other examples can include multiple blocks per plane.

Figure 3:
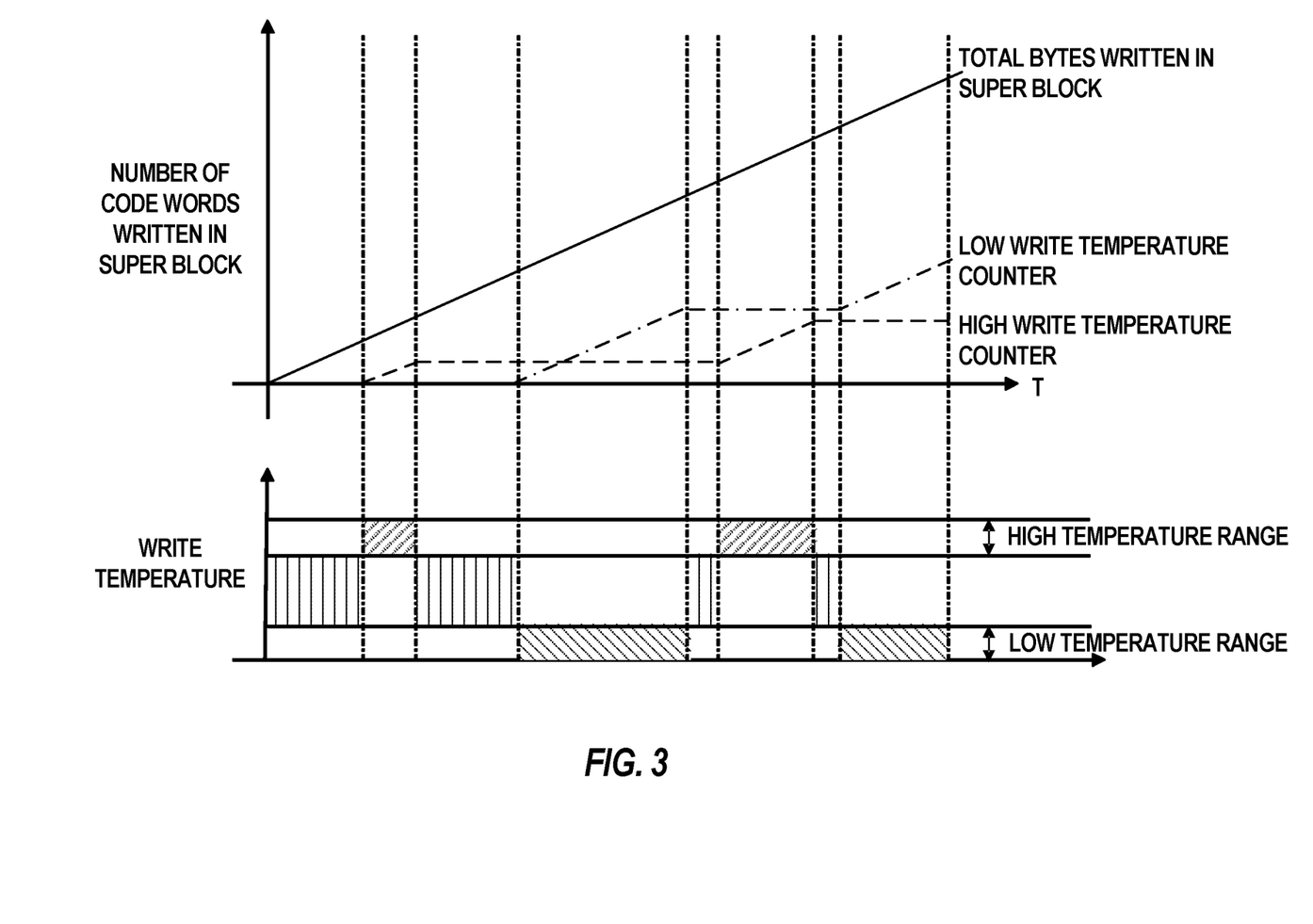
FIG. 3 illustrates an example of block write temperature tracking in a superblock, according to an embodiment.

FIG. 3 illustrates an example of block write temperature tracking in a superblock, according to an embodiment. The bottom portion of the table illustrates writes with acceptable or extreme temperatures of the NAND device during the writes. The top portion of the table illustrates the change in total bytes written as well as the incrementing of the LWTC and HWTC counters that correspond to those writes. In an example, HWTC and LWTC counters are maintained for each superblock. Code words written at high ambient temperatures are categorized as high-temperature count towards HWTC and code words written at low ambient temperatures are categorized as low-temperature count towards LWTC. After a superblock is closed, HWTC and LWTC are dumped to non-volatile memory (e.g., into a NAND array). The process can be repeated for each open superblock. Then, using these counter values, firmware running on a NAND device (e.g., a memory system controller, a memory controller, or memory manager) can snapshot the percentage of a superblock written at acceptable nominal temperature, high temperature, and low temperature. These values can then be used to selectively refresh superblocks to prevent future read errors due to extreme cross-temperature situations.

Figure 4:
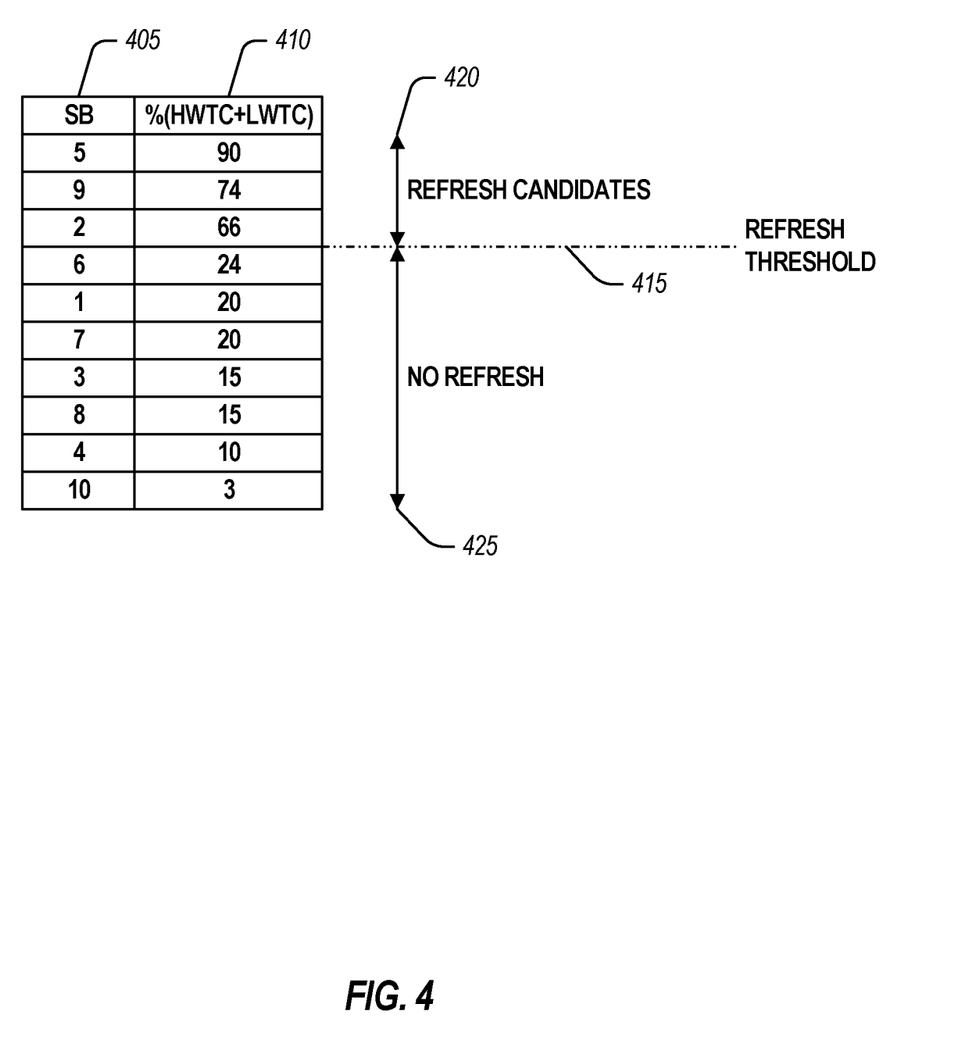
FIG. 4 illustrates an example of a data structure to implement temperature informed memory refresh, according to an embodiment.

FIG. 4 illustrates an example of a data structure to implement temperature informed memory refresh, according to an embodiment. The data structure includes a superblock identifier field 405 and a percentage of bytes written at an extreme temperature field 410 for each superblock record. As illustrated, the records are sorted by the percentage of bytes written at an extreme temperature field 410. The sorting occurs when the device is at an acceptable temperature. Blocks with a percentage of (HWTC+LWTC) writes versus acceptable temperature writes that exceed a refresh threshold 415 are marked for refresh (e.g., folding). These blocks are the refresh candidates 420 whereas the remaining blocks 425 will not have a refresh performed based on the extreme temperature counters at this time.

The NAND device can have a performance versus RBER profile, for example, established during manufacturing. As noted above, the RBER can be a function of High and Low Write temperatures. Depending on the RBER and the code word rate, the refresh threshold 415 can be configured to maintain the RBER versus performance profile of the NAND device. For example, if more than 25% of a superblock is written at an extreme temperature deteriorates the performance, then the refresh threshold 415 is set at 25%.

Figure 5:
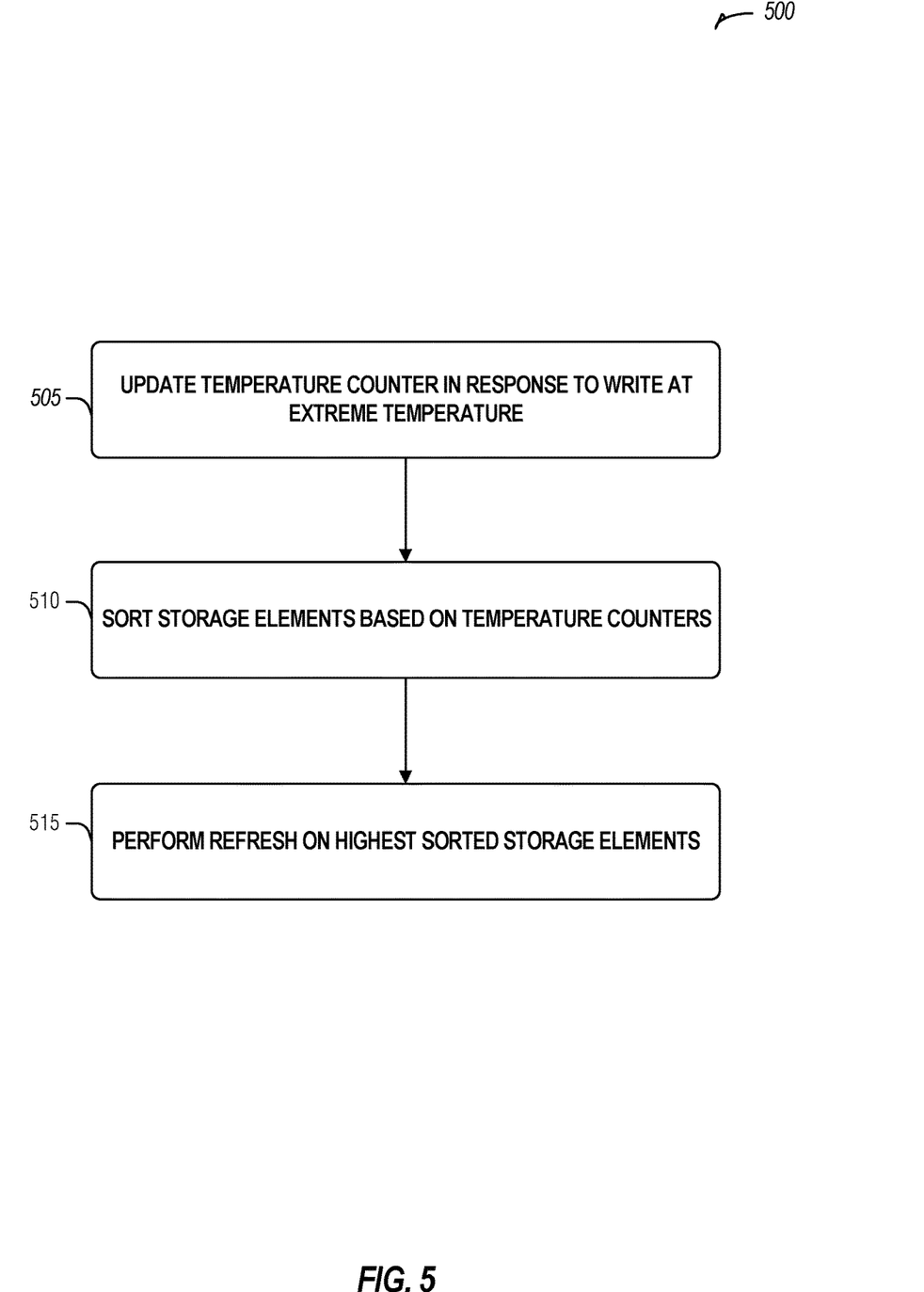
FIG. 5 illustrates a flowchart of a method for temperature informed memory refresh, according to an embodiment.

FIG. 5 illustrates a flowchart of a method 500 for temperature informed memory refresh, according to an embodiment. The operations of the method 500 are implemented in electronic hardware, such as that described above with respect to FIG. 1. (e.g., a memory system controller), or below with respect to FIG. 6 (e.g., circuitry).

At operation 505, a temperature counter is updated in response to a memory device write performed under an extreme temperature. Here, the write is performed on a memory device element in the memory device. In an example, the memory device write is a code word write. In an example, the memory device element is a superblock.

In an example, the temperature counter is twenty bits. In an example, the temperature counter is reset to zero in response to erasure of the memory device element. In an example, an extreme temperature is below a low write temperature threshold for the NAND device. In an example, the temperature counter includes a Low Temperature Write Counter (LWTC). In an example, an extreme temperature is above a high write temperature threshold for the NAND device. In an example, the temperature counter includes a High Temperature Write Counter (HWTC).

In an example, the temperature counter is stored separately from the memory device element. In an example, the temperature counter is stored in a volatile memory portion of the NAND device in response to the memory device element being open. In an example, the temperature counter is stored in the memory device in response to the memory device element being closed.

At operation 510, the memory device element is sorted above other memory device elements in the memory device based on the temperature counter. In an example, the sorting includes combining a LWTC and a HWTC to create a sort-value that is compared against sort-values calculated for the other memory device elements. In an example, the sort-value is beyond a minimum temperature-based refresh threshold. In an example, the minimum temperature-based refresh threshold is based on a raw bit error rate (RBER) of the NAND device. In an example, the minimum temperature-based refresh threshold is a percentage of bytes in the memory device element written at an extreme temperature.

At operation 515, a refresh is performed on the memory device element in response to the sorting. In an example, the sorting is performed is in response to closure of the memory device element.

In an example, performing the refresh includes copying contents of the memory device element to a new memory device element. In an example, the copying of the contents is performed in response to a non-extreme temperature of the new memory device element. In an example, the copying of the contents is performed in response to a low-utilization period of the NAND device.

Figure 6:
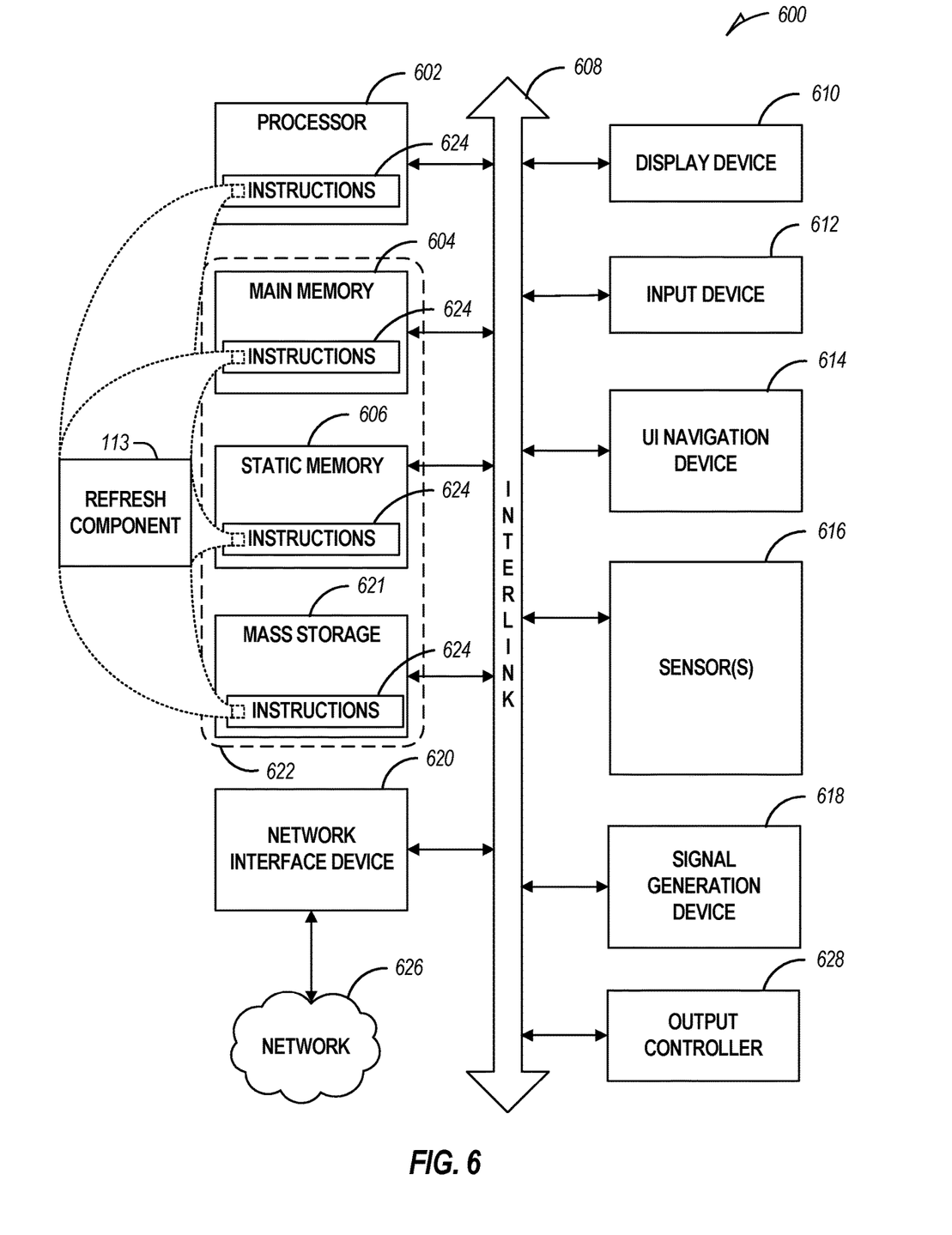
FIG. 6 is a block diagram illustrating an example of a machine upon which one or more embodiments can be implemented.

FIG. 6 illustrates a block diagram of an example machine 600 upon which any one or more of the techniques (e.g., methodologies) discussed herein can perform. In alternative embodiments, the machine 600 can operate as a standalone device or can be connected (e.g., networked) to other machines. In a networked deployment, the machine 600 can operate in the capacity of a server machine, a client machine, or both in server-client network environments. In an example, the machine 600 can act as a peer machine in peer-to-peer (P2P) (or other distributed) network environment. The machine 600 can be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, can include, or can operate by, logic, components, devices, packages, or mechanisms. Circuitry is a collection (e.g., set) of circuits implemented in tangible entities that include hardware (e.g., simple circuits, gates, logic, etc.). Circuitry membership can be flexible over time and underlying hardware variability. Circuitries include members that can, alone or in combination, perform specific tasks when operating. In an example, hardware of the circuitry can be immutably designed to carry out a specific operation (e.g., hardwired). In an example, the hardware of the circuitry can include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components can be used in more than one member of more than one circuitry. For example, under operation, execution units can be used in a first circuit of a first circuitry at one point in time and reused by a second circuit in the first circuitry, or by a third circuit in a second circuitry at a different time.

The machine (e.g., computer system) 600 (e.g., the host device 105, the memory system 110, etc.) can include a hardware processor 602 (e.g., a central processing unit (CPU), a graphics processing unit (GPU), a hardware processor core, or any combination thereof, such as the memory system controller 115, etc.), a main memory 604 and a static memory 606, some or all of which can communicate with each other via an interlink (e.g., bus) 608. The machine 600 can further include a display unit 610, an alphanumeric input device 612 (e.g., a keyboard), and a user interface (UI) navigation device 614 (e.g., a mouse). In an example, the display unit 610, input device 612 and UI navigation device 614 can be a touch screen display. The machine 600 can additionally include a storage device (e.g., drive unit) 616, a signal generation device 618 (e.g., a speaker), a network interface device 620, and one or more sensors 616, such as a global positioning system (GPS) sensor, compass, accelerometer, or other sensor. The machine 600 can include an output controller 628, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 616 can include a machine readable medium 622 on which is stored one or more sets of data structures or instructions 624 (e.g., software) embodying or utilized by any one or more of the techniques or functions described herein. The instructions 624 can also reside, completely or at least partially, within the main memory 604, within static memory 606, or within the hardware processor 602 during execution thereof by the machine 600. In an example, one or any combination of the hardware processor 602, the main memory 604, the static memory 606, or the storage device 616 can constitute the machine readable medium 622.

While the machine readable medium 622 is illustrated as a single medium, the term "machine readable medium" can include a single medium or multiple media (e.g., a centralized or distributed database, or associated caches and servers) configured to store the one or more instructions 624.

The term "machine readable medium" can include any medium that is capable of storing, encoding, or carrying instructions for execution by the machine 600 and that cause the machine 600 to perform any one or more of the techniques of the present disclosure, or that is capable of storing, encoding or carrying data structures used by or associated with such instructions. Non-limiting machine readable medium examples can include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media can include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 624 (e.g., software, programs, an operating system (OS), etc.) or other data are stored on the storage device 621, can be accessed by the memory 604 for use by the processor 602. The memory 604 (e.g., DRAM) is typically fast, but volatile, and thus a different type of storage than the storage device 621 (e.g., an SSD), which is suitable for long-term storage, including while in an "off" condition. The instructions 624 or data in use by a user or the machine 600 are typically loaded in the memory 604 for use by the processor 602. When the memory 604 is full, virtual space from the storage device 621 can be allocated to supplement the memory 604; however, because the storage 621 device is typically slower than the memory 604, and write speeds are typically at least twice as slow as read speeds, use of virtual memory can greatly reduce user experience due to storage device latency (in contrast to the memory 604, e.g., DRAM). Further, use of the storage device 621 for virtual memory can greatly reduce the usable lifespan of the storage device 621.

In contrast to virtual memory, virtual memory compression (e.g., the Linux® kernel feature "ZRAM") uses part of the memory as compressed block storage to avoid paging to the storage device 621. Paging takes place in the compressed block until it is necessary to write such data to the storage device 621. Virtual memory compression increases the usable size of memory 604, while reducing wear on the storage device 621.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 624 can further be transmitted or received over a communications network 626 using a transmission medium via the network interface device 620 utilizing any one of a number of transfer protocols (e.g., frame relay, internet protocol (IP), transmission control protocol (TCP), user datagram protocol (UDP), hypertext transfer protocol (HTTP), etc.). Example communication networks can include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 620 can include one or more physical jacks (e.g., Ethernet, coaxial, or phone jacks) or one or more antennas to connect to the communications network 626. In an example, the network interface device 620 can include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 600, and includes digital or analog communications signals or other intangible medium to facilitate communication of such software.

Example 1 is a memory system for temperature informed memory refresh, the memory system comprising: a memory device; and a processing device, communicatively coupled to the memory device when in operation, the processing device to: update a temperature counter in response to a memory device write performed under an extreme temperature, the write performed on a memory device element in the memory device; sort the memory device element above other memory device elements in the memory device based on the temperature counter; and perform a refresh on the memory device element in response to the sorting.

In Example 2, the subject matter of Example 1 includes, wherein the memory device element is a superblock.

In Example 3, the subject matter of Examples 1-2 includes, wherein an extreme temperature is below a low write temperature threshold for the memory device.

In Example 4, the subject matter of Example 3 includes, wherein the temperature counter includes a Low Temperature Write Counter (LWTC).

In Example 5, the subject matter of Examples 1-4 includes, wherein an extreme temperature is above a high write temperature threshold for the memory device.

In Example 6, the subject matter of Example 5 includes, wherein the temperature counter includes a High Temperature Write Counter (HWTC).

In Example 7, the subject matter of Examples 1-6 includes, wherein, to sort the memory device element, the processing device combines a Low Temperature Write Counter (LWTC) and a High Temperature Write Counter (HWTC) to create a sort-value that is compared against sort-values calculated for the other memory device elements.

In Example 8, the subject matter of Example 7 includes, wherein the sort-value is beyond a minimum temperature-based refresh threshold.

In Example 9, the subject matter of Example 8 includes, wherein the minimum temperature-based refresh threshold is based on a raw bit error rate (RBER) of the memory device.

In Example 10, the subject matter of Examples 8-9 includes, wherein the minimum temperature-based refresh threshold is a percentage of bytes in the memory device element written at an extreme temperature.

In Example 11, the subject matter of Examples 1-10 includes, wherein the temperature counter is stored separately from the memory device element.

In Example 12, the subject matter of Example 11 includes, wherein the temperature counter is stored in a volatile memory portion of the memory device in response to the memory device element being open.

In Example 13, the subject matter of Examples 11-12 includes, wherein the temperature counter is stored in the memory device in response to the memory device element being closed.

In Example 14, the subject matter of Examples 1-13 includes, wherein the memory device write is a code word write.

In Example 15, the subject matter of Examples 1-14 includes, wherein the processing device performs the sort in response to closure of the memory device element.

In Example 16, the subject matter of Examples 1-15 includes, wherein the temperature counter is twenty bits.

In Example 17, the subject matter of Examples 1-16 includes, wherein the temperature counter is reset to zero in response to erasure of the memory device element.

In Example 18, the subject matter of Examples 1-17 includes, wherein, to perform the refresh, the processing device copies contents of the memory device element to a new memory device element.

In Example 19, the subject matter of Example 18 includes, wherein the processing device copies the contents in response to a non-extreme temperature of the new memory device element.

In Example 20, the subject matter of Examples 18-19 includes, wherein the processing device copies the content in response to a low-utilization period of the memory device.

Example 21 is a method for temperature informed memory refresh, the method comprising: updating a temperature counter in response to a memory device write performed under an extreme temperature, the memory device included in a memory system, the write performed on a memory device element in the memory device; sorting the memory device element above other memory device elements in the memory device based on the temperature counter; and performing a refresh on the memory device element in response to the sorting.

In Example 22, the subject matter of Example 21 includes, wherein the memory device element is a superblock.

In Example 23, the subject matter of Examples 21-22 includes, wherein an extreme temperature is below a low write temperature threshold for the memory device.

In Example 24, the subject matter of Example 23 includes, wherein the temperature counter includes a Low Temperature Write Counter (LWTC).

In Example 25, the subject matter of Examples 21-24 includes, wherein an extreme temperature is above a high write temperature threshold for the memory device.

In Example 26, the subject matter of Example 25 includes, wherein the temperature counter includes a High Temperature Write Counter (HWTC).

In Example 27, the subject matter of Examples 21-26 includes, wherein sorting the memory device element includes combining a Low Temperature Write Counter (LWTC) and a High Temperature Write Counter (HWTC) to create a sort-value that is compared against sort-values calculated for the other memory device elements.

In Example 28, the subject matter of Example 27 includes, wherein the sort-value is beyond a minimum temperature-based refresh threshold.

In Example 29, the subject matter of Example 28 includes, wherein the minimum temperature-based refresh threshold is based on a raw bit error rate (RBER) of the memory device.

In Example 30, the subject matter of Examples 28-29 includes, wherein the minimum temperature-based refresh threshold is a percentage of bytes in the memory device element written at an extreme temperature.

In Example 31, the subject matter of Examples 21-30 includes, wherein the temperature counter is stored separately from the memory device element.

In Example 32, the subject matter of Example 31 includes, wherein the temperature counter is stored in a volatile memory portion of the memory device in response to the memory device element being open.

In Example 33, the subject matter of Examples 31-32 includes, wherein the temperature counter is stored in the memory device in response to the memory device element being closed.

In Example 34, the subject matter of Examples 21-33 includes, wherein the memory device write is a code word write.

In Example 35, the subject matter of Examples 21-34 includes, wherein the sorting is performed in response to closure of the memory device element.

In Example 36, the subject matter of Examples 21-35 includes, wherein the temperature counter is twenty bits.

In Example 37, the subject matter of Examples 21-36 includes, wherein the temperature counter is reset to zero in response to erasure of the memory device element.

In Example 38, the subject matter of Examples 21-37 includes, wherein performing the refresh includes copying contents of the memory device element to a new memory device element.

In Example 39, the subject matter of Example 38 includes, wherein copying the contents is performed in response to a non-extreme temperature of the new memory device element.

In Example 40, the subject matter of Examples 38-39 includes, wherein copying the content is performed in response to a low-utilization period of the memory device.

Example 41 is a non-transitory machine readable medium including instructions that, when executed by a processing device, cause the processing device to perform operations comprising: updating a temperature counter in response to a memory device write performed under an extreme temperature, the memory device included in a memory system, the write performed on a memory device element in the memory device; sorting the memory device element above other memory device elements in the memory device based on the temperature counter; and performing a refresh on the memory device element in response to the sorting.

In Example 42, the subject matter of Example 41 includes, wherein the memory device element is a superblock.

In Example 43, the subject matter of Examples 41-42 includes, wherein an extreme temperature is below a low write temperature threshold for the memory device.

In Example 44, the subject matter of Example 43 includes, wherein the temperature counter includes a Low Temperature Write Counter (LWTC).

In Example 45, the subject matter of Examples 41-44 includes, wherein an extreme temperature is above a high write temperature threshold for the memory device.

In Example 46, the subject matter of Example 45 includes, wherein the temperature counter includes a High Temperature Write Counter (HWTC).

In Example 47, the subject matter of Examples 41-46 includes, wherein sorting the memory device element includes combining a Low Temperature Write Counter (LWTC) and a High Temperature Write Counter (HWTC) to create a sort-value that is compared against sort-values calculated for the other memory device elements.

In Example 48, the subject matter of Example 47 includes, wherein the sort-value is beyond a minimum temperature-based refresh threshold.

In Example 49, the subject matter of Example 48 includes, wherein the minimum temperature-based refresh threshold is based on a raw bit error rate (RBER) of the memory device.

In Example 50, the subject matter of Examples 48-49 includes, wherein the minimum temperature-based refresh threshold is a percentage of bytes in the memory device element written at an extreme temperature.

In Example 51, the subject matter of Examples 41-50 includes, wherein the temperature counter is stored separately from the memory device element.

In Example 52, the subject matter of Example 51 includes, wherein the temperature counter is stored in a volatile memory portion of the memory device in response to the memory device element being open.

In Example 53, the subject matter of Examples 51-52 includes, wherein the temperature counter is stored in the memory device in response to the memory device element being closed.

In Example 54, the subject matter of Examples 41-53 includes, wherein the memory device write is a code word write.

In Example 55, the subject matter of Examples 41-54 includes, wherein the sorting is performed in response to closure of the memory device element.

In Example 56, the subject matter of Examples 41-55 includes, wherein the temperature counter is twenty bits.

In Example 57, the subject matter of Examples 41-56 includes, wherein the temperature counter is reset to zero in response to erasure of the memory device element.

In Example 58, the subject matter of Examples 41-57 includes, wherein performing the refresh includes copying contents of the memory device element to a new memory device element.

In Example 59, the subject matter of Example 58 includes, wherein copying the contents is performed in response to a non-extreme temperature of the new memory device element.

In Example 60, the subject matter of Examples 58-59 includes, wherein copying the contents is performed in response to a low-utilization period of the memory device.

Example 61 is a system for temperature informed memory refresh, the system comprising: means for updating a temperature counter in response to a memory device write performed under an extreme temperature, the memory device included in a memory system, the write performed on a memory device element in the memory device; means for sorting the memory device element above other memory device elements in the memory device based on the temperature counter; and means for performing a refresh on the memory device element in response to the sorting.

In Example 62, the subject matter of Example 61 includes, wherein the memory device element is a superblock.

In Example 63, the subject matter of Examples 61-62 includes, wherein an extreme temperature is below a low write temperature threshold for the memory device.

In Example 64, the subject matter of Example 63 includes, wherein the temperature counter includes a Low Temperature Write Counter (LWTC).

In Example 65, the subject matter of Examples 61-64 includes, wherein an extreme temperature is above a high write temperature threshold for the memory device.

In Example 66, the subject matter of Example 65 includes, wherein the temperature counter includes a High Temperature Write Counter (HWTC).

In Example 67, the subject matter of Examples 61-66 includes, wherein the means for sorting the memory device element include means for combining a Low Temperature Write Counter (LWTC) and a High Temperature Write Counter (HWTC) to create a sort-value that is compared against sort-values calculated for the other memory device elements.

In Example 68, the subject matter of Example 67 includes, wherein the sort-value is beyond a minimum temperature-based refresh threshold.

In Example 69, the subject matter of Example 68 includes, wherein the minimum temperature-based refresh threshold is based on a raw bit error rate (RBER) of the memory device.

In Example 70, the subject matter of Examples 68-69 includes, wherein the minimum temperature-based refresh threshold is a percentage of bytes in the memory device element written at an extreme temperature.

In Example 71, the subject matter of Examples 61-70 includes, wherein the temperature counter is stored separately from the memory device element.

In Example 72, the subject matter of Example 71 includes, wherein the temperature counter is stored in a volatile memory portion of the memory device in response to the memory device element being open.

In Example 73, the subject matter of Examples 71-72 includes, wherein the temperature counter is stored in the memory device in response to the memory device element being closed.

In Example 74, the subject matter of Examples 61-73 includes, wherein the memory device write is a code word write.

In Example 75, the subject matter of Examples 61-74 includes, wherein the sorting is performed in response to closure of the memory device element.

In Example 76, the subject matter of Examples 61-75 includes, wherein the temperature counter is twenty bits.

In Example 77, the subject matter of Examples 61-76 includes, wherein the temperature counter is reset to zero in response to erasure of the memory device element.

In Example 78, the subject matter of Examples 61-77 includes, wherein the means for performing the refresh include means for copying contents of the memory device element to a new memory device element.

In Example 79, the subject matter of Example 78 includes, wherein copying the contents is performed in response to a non-extreme temperature of the new memory device element.

In Example 80, the subject matter of Examples 78-79 includes, wherein copying the contents is performed in response to a low-utilization period of the memory device.

Example 81 is at least one machine-readable medium including instructions that, when executed by processing circuitry, cause the processing circuitry to perform operations to implement of any of Examples 1-80.

Example 82 is an apparatus comprising means to implement of any of Examples 1-80.

Example 83 is a system to implement of any of Examples 1-80.

Example 84 is a method to implement of any of Examples 1-80.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" can include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third,"

etc. are used merely as labels, and are not intended to impose numerical requirements on their objects.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but can instead be generally perpendicular to the surface of the substrate, and can form an acute angle with the surface of the substrate (e.g., between 60 and 120 degrees, etc.).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell can be programmed to an erased state).

It will be understood that when an element is referred to as being "on," "connected to" or "coupled with" another element, it can be directly on, connected, or coupled with the other element or intervening elements can be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

The above description is intended to be illustrative, and not restrictive. For example, the above-described examples (or one or more aspects thereof) can be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory system comprising:
a memory component comprising a plurality of memory component elements; and
a processing device, communicatively coupled to the memory component when in operation, the processing device configured to perform operations comprising:
resetting a write temperature counter for an individual memory component element, of the plurality of memory component elements, in response to the individual memory component element being either erased or opened;
measuring an ambient temperature while a write is performed on the individual memory component element;
updating the write temperature counter in response to the ambient temperature being outside of a defined temperature window;
generating, based on at least the write temperature counter, a sort-value for the individual memory component element by combining a Low Write Temperature Counter and a High Write Temperature Counter; and
selecting the individual memory component element for refresh based on the sort-value.

2. The memory system of claim 1, wherein the operations comprise:
performing a refresh on the individual memory component element.

3. The memory system of claim 2, wherein the performing of the refresh comprises copying contents of the individual memory component element to a new memory component element.

4. The memory system of claim 3, wherein the copying is performed in response to a non-extreme temperature of the new memory component element.

5. The memory system of claim 1, wherein the selecting of the individual memory component element for refresh based on the sort-value comprises:
comparing the sort-value of the individual memory component element against one or more sort-values generated for other memory component elements of the memory component.

6. The memory system of claim 1, wherein the plurality of memory component elements comprises a plurality of memory cells.

7. The memory system of claim 1, wherein the operations comprise:
storing the write temperature counter on a non-volatile memory portion of the memory component.

8. A method comprising:
resetting a write temperature counter for an individual memory component element, of a memory component, in response to the individual memory component element being either erased or opened;
measuring an ambient temperature while a write is performed on the individual memory component element;
updating the write temperature counter in response to the ambient temperature being outside of a defined temperature window;
generating, based on at least the write temperature counter, a sort-value for the individual memory component element by combining a Low Write Temperature Counter and a High Write Temperature Counter; and
selecting the individual memory component element for refresh based on the sort-value.

9. The method of claim 8, comprising:
performing a refresh on the individual memory component element.

10. The method of claim 9, wherein the performing of the refresh comprises copying contents of the individual memory component element to a new memory component element.

11. The method of claim 10, wherein the copying is performed in response to a non-extreme temperature of the new memory component element.

12. The method of claim 8, wherein the selecting of the individual memory component element for refresh based on the sort-value comprises:
comparing the sort-value of the individual memory component element against one or more sort-values generated for other memory component elements of the memory component.

13. The method of claim 8, wherein the memory component comprises a plurality of memory cells.

14. The method of claim 8, comprising:
storing the write temperature counter on a non-volatile memory portion of the memory component.

15. A non-transitory machine readable medium including instructions that, when executed by a processing device, cause the processing device to perform operations comprising:
resetting a write temperature counter for an individual memory component element, of a memory component, in response to the individual memory component element being either erased or opened;
measuring an ambient temperature while a write is performed on the individual memory component element;
updating the write temperature counter in response to the ambient temperature being outside of a defined temperature window;
generating, based on at least the write temperature counter, a sort-value for the individual memory component element by combining a Low Write Temperature Counter and a High Write Temperature Counter; and
selecting the individual memory component element for refresh based on the sort-value.

16. The non-transitory machine readable medium of claim 15, wherein the operations comprise:
performing a refresh on the individual memory component element.

17. The non-transitory machine readable medium of claim 16, wherein the performing of the refresh comprises copying contents of the individual memory component element to a new memory component element.

18. The non-transitory machine readable medium of claim 17, wherein the copying is performed in response to a non-extreme temperature of the new memory component element.

19. The non-transitory machine readable medium of claim 15, wherein the selecting of the individual memory component element for refresh based on the sort-value comprises:
comparing the sort-value of the individual memory component element against one or more sort-values generated for other memory component elements of the memory component.

20. The non-transitory machine readable medium of claim 15, wherein the memory component comprises a plurality of memory cells.

* * * * *